(12) United States Patent
Lee et al.

(10) Patent No.: US 9,363,901 B2
(45) Date of Patent: Jun. 7, 2016

(54) MAKING A PLURALITY OF INTEGRATED CIRCUIT PACKAGES

(71) Applicant: Texas Instruments Incorporated, Dallas, TX (US)

(72) Inventors: Wen Yu Lee, New Taipei (TW); Steven Su, Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/965,052

(22) Filed: Dec. 10, 2015

(65) Prior Publication Data

US 2016/0100490 A1    Apr. 7, 2016

Related U.S. Application Data

(62) Division of application No. 14/444,516, filed on Jul. 28, 2014.

(51) Int. Cl.
| | |
|---|---|
| H01L 21/44 | (2006.01) |
| H01L 21/48 | (2006.01) |
| H05K 3/30 | (2006.01) |
| H01L 21/56 | (2006.01) |
| H01L 21/78 | (2006.01) |

(52) U.S. Cl.
CPC ............ *H05K 3/301* (2013.01); *H01L 21/4825* (2013.01); *H01L 21/565* (2013.01); *H01L 21/78* (2013.01)

(58) Field of Classification Search
CPC ............ H01L 23/495; H01L 23/49541; H01L 23/503; H01L 21/78; H01L 21/565; H01L 21/4825
USPC .......................................... 438/123; 257/666
See application file for complete search history.

(56) References Cited

U.S. PATENT DOCUMENTS

| | | | | |
|---|---|---|---|---|
| 5,682,673 A | * | 11/1997 | Fehr ...................... | H01L 21/565 174/529 |
| 6,424,024 B1 | * | 7/2002 | Shih .................... | H01L 23/3107 257/666 |
| 6,455,356 B1 | * | 9/2002 | Glenn ................. | H01L 23/3107 257/E23.039 |
| 6,828,660 B2 | | 12/2004 | Abbott | |
| 7,192,809 B2 | * | 3/2007 | Abbott ................ | H01L 21/4842 257/666 |
| 7,968,998 B1 | * | 6/2011 | Choi ................. | H01L 23/49541 257/666 |
| 8,198,137 B2 | | 6/2012 | Heyl | |
| 2001/0030355 A1 | * | 10/2001 | Mclellan ............. | H01L 21/4832 257/666 |
| 2003/0116833 A1 | * | 6/2003 | Lee ....................... | H01L 21/565 257/666 |
| 2006/0189037 A1 | * | 8/2006 | Abbott ................ | H01L 21/4842 438/123 |
| 2011/0140249 A1 | * | 6/2011 | Lee ....................... | H01L 21/561 257/670 |

* cited by examiner

*Primary Examiner* — Nitin Parekh
(74) *Attorney, Agent, or Firm* — Steven A. Shaw; Frank D. Cimino

(57) ABSTRACT

A method of making a plurality of integrated circuit packages provides a metal strip. A first leadframe having a first die pad is formed on the metal strip. Also formed are a first plurality of leads with proximal ends adjacent to the first die pad, free distal ends positioned outwardly from the first die pad, and a first leadframe dam bar intersecting the proximal ends of the first plurality of leads. A second leadframe having a second die pad, a second plurality of leads with proximal ends adjacent to the second die pad and free distal ends positioned outwardly from the second die pad and a second leadframe dam bar intersecting the proximal ends of the second plurality of leads are formed on the metal strip. The free distal ends of said second plurality of leads are aligned with and adjacent to said free distal ends of said first plurality of leads.

11 Claims, 11 Drawing Sheets

MAKING A PLURALITY OF INTEGRATED CIRCUIT PACKAGES

CROSS REFERENCE TO RELATED APPLICATIONS

This application is a Divisional of and claims priority to U.S. patent application Ser. No. 14/444,516 filed Jul. 28, 2014. Said application herein incorporated by reference in its entirety.

BACKGROUND

Integrated circuit packages typically comprise at least one leadframe and at least one integrated circuit die. The integrated circuit die is generally mounted on a die pad of the leadframe and contacts on the die are usually electrically connected to leads of the leadframe. These leads may also be electrically connected to other circuitry inside or outside the integrated circuit package. The die and portions of the leadframe are usually encapsulated in an epoxy mold compound. Since integrated circuit packages are used for many different purposes, there are many different types of integrated circuit packages.

Most leadframes are formed on a single, thin sheet of metal as by stamping or etching. Multiple interconnected leadframes may be formed on a single leadframe sheet. Leadframes on the sheet are usually arranged in rows and columns. Usually die mounting, die to lead attachment (e.g. wire bonding) and epoxy encapsulation take place while the leadframes are still integrally connected on the leadframe sheet. After such processes are completed, the leadframe, and sometimes the encapsulation material, are severed ("singulated" or "diced") with a cutting tool, such as a saw or laser. These singulation cuts separate the leadframe sheet into separate integrated circuit packages, each typically including at least one leadframe, at least one die, electrical connections between the die and leadframe (such as gold or copper bond wires) and the plastic material which encapsulates at least part of these structures.

One common type of integrated circuit packages is "SOP" (Small Outline Packages) in which leads protrude from opposite sides of the encapsulated portion of the package. Another common type is known as "QFP" (Quad Flat Packages). In QFP, the leads protrude outwardly from four lateral sides of the encapsulated portion of the package. The protruding leads in, for example a Gull Wing type SOP, may be bent into an appropriate shape after the integrated circuit package has been severed from the leadframe. Such integrated circuit packages are often used in surface mount technology ("SMT") in which the leads extending from the sides of the package are soldered to surface contact portions of a printed circuit board or the like.

DETAILED DESCRIPTION

Figure 8:
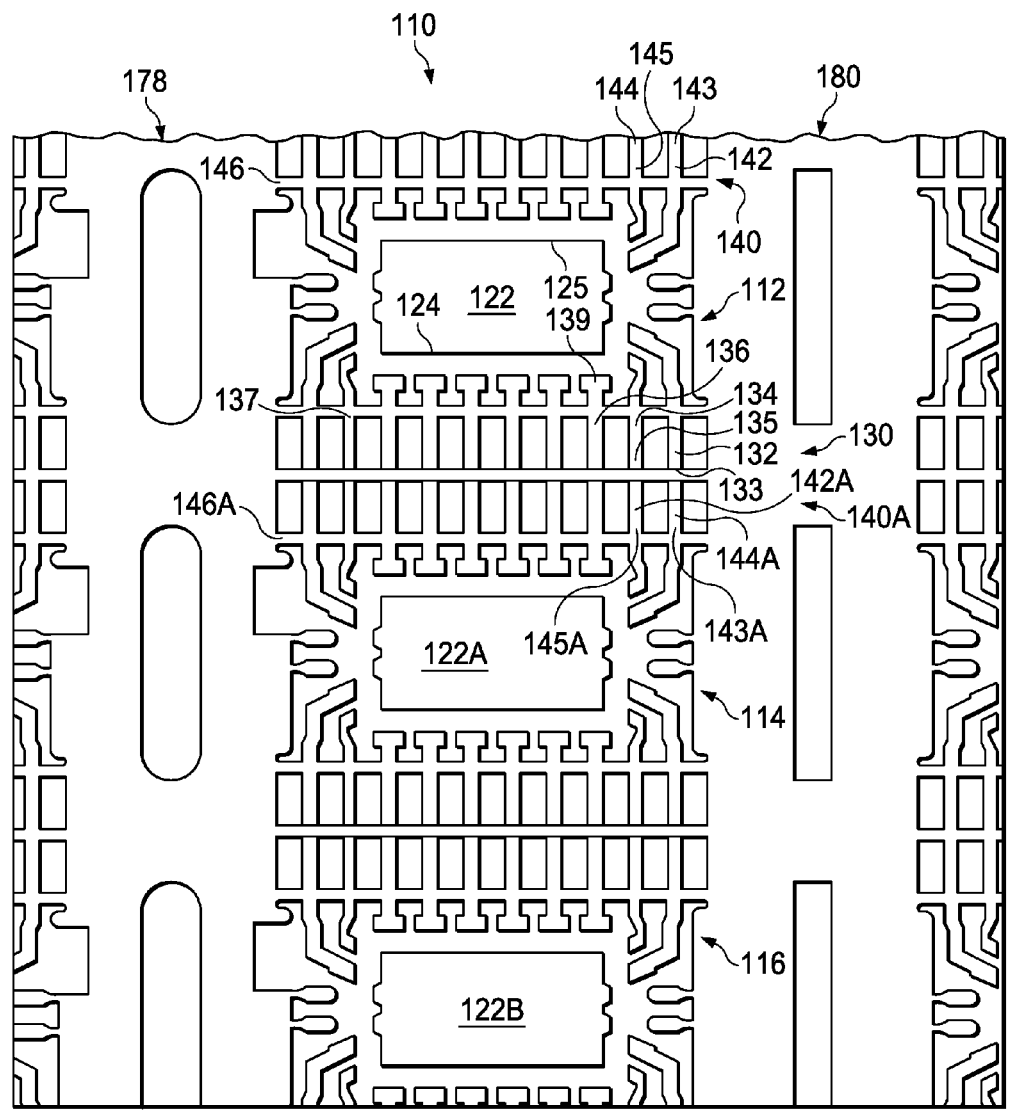
FIG. 8 is a top plan view of a portion of an example embodiment of a new SOP type leadframe strip in which each leadframe portion thereof has leads connected by first dam bars and in which there are no second dam bars.
Figure 12:
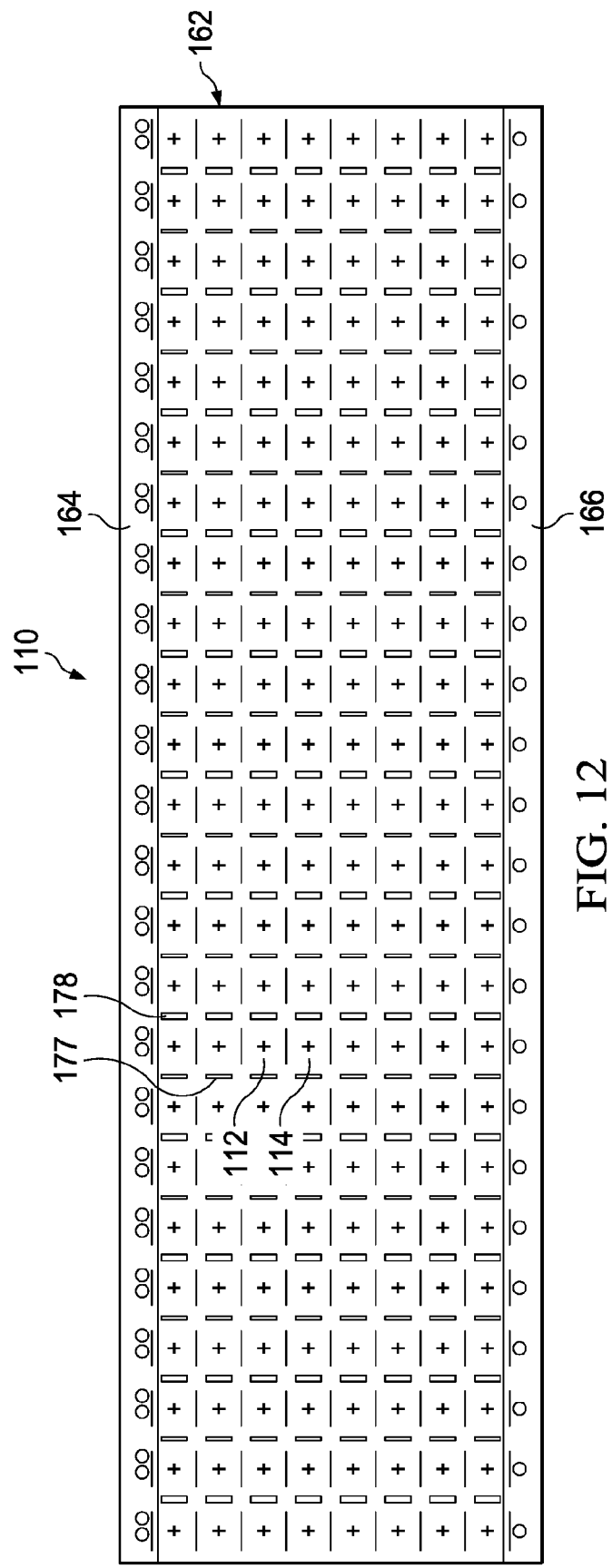
FIG. 12 is a top plan view of an SOP type leadframe strip, a portion of which is shown in FIG. 8.

This description, in general, discloses a leadframe strip 110, FIGS. 8 and 12, that comprises a first leadframe 112 and a second leadframe 114, which are integrally connected. The first leadframe 112 has a die pad 122 and a first plurality of generally parallel leads 130, e.g., 132, 134, each extending outwardly relative to the die pad 122 and terminating in free ends, e.g., 133, 135, etc. The leadframe strip 110 includes a second leadframe 114 having a second die pad 122A and a second plurality of generally parallel leads 140A, for example, 142A and 144A, extending outwardly relative to the second die pad 122A and terminating in free ends, e.g., 143A, 145A. The free ends 143A, 145A, etc., of the second plurality of leads 140A are positioned in nontouching adjacent relationship with the free ends 133, 135, etc., of the first plurality of leads 130.

Having thus generally described an embodiment of a new leadframe strip, certain prior art leadframe embodiments and methods of use thereof will now be described. The new leadframe embodiments and methods of use thereof for making integrated circuit ("IC") packages are then described in detail.

Figure 1:
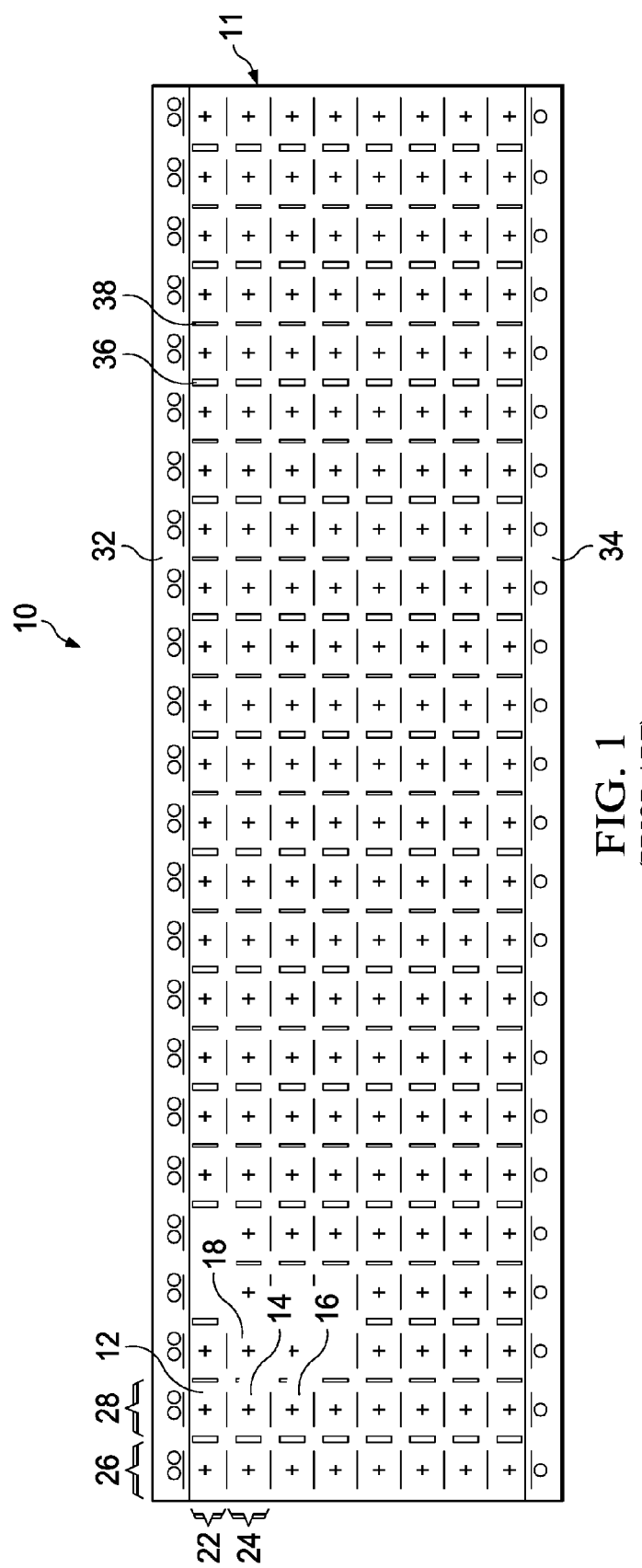
FIG. 1 is a top plan view of a prior art leadframe strip.

FIG. 1 is a top plan view of a prior art leadframe strip 10. This strip 10 has a leadframe area 11 that includes a gridwork of interconnected leadframes 12, 14, 16, 18, etc., which are arranged in rows 22, 24, etc. and columns 26, 28, etc. Side rails 32, 34 that facilitate handling of the leadframe area 11 are integrally attached at opposite sides of the leadframe area 11. Connecting strips 36, 38, etc. are positioned between adjacent columns, e.g., 26, 28, etc. of lead frames.

Figure 2:
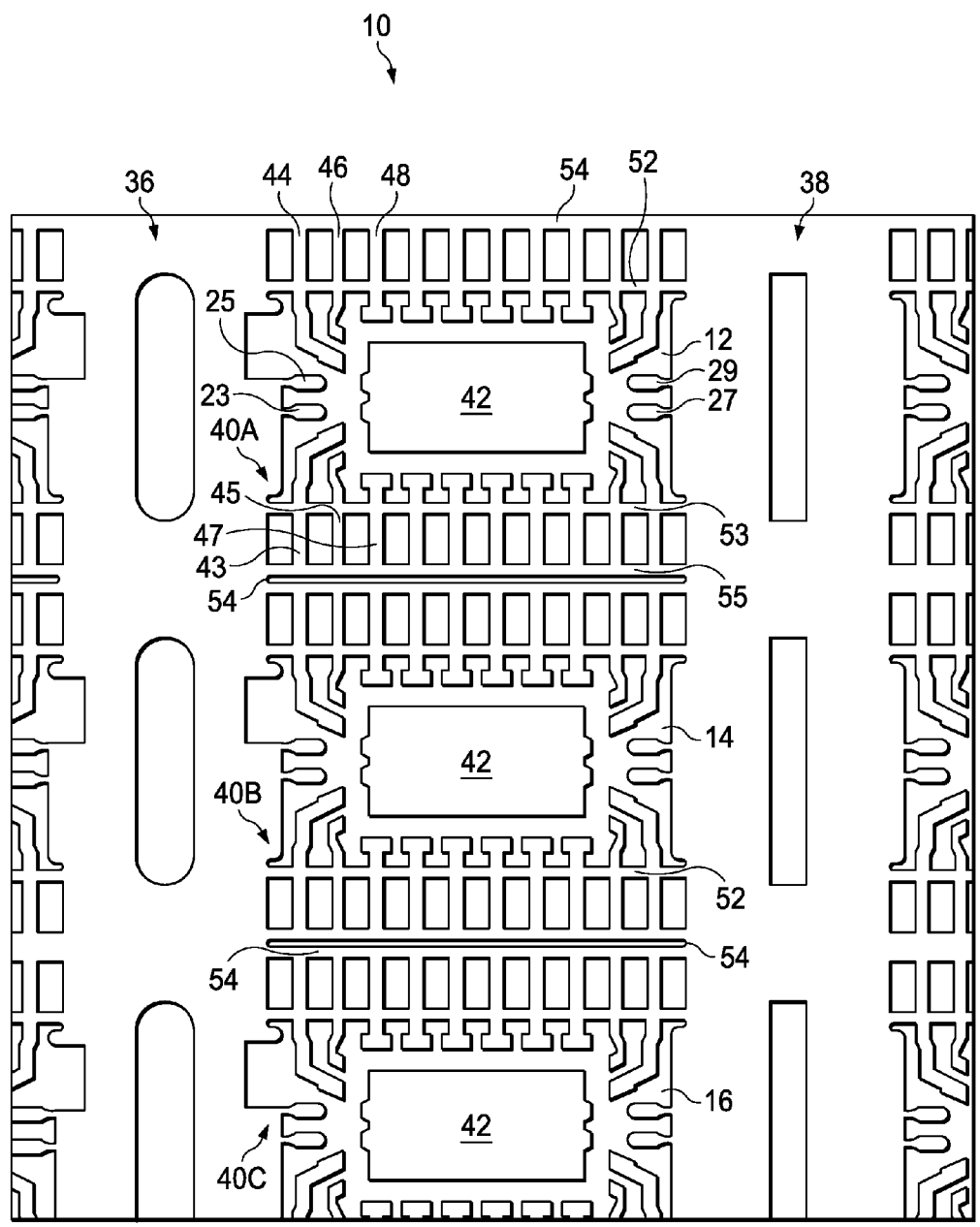
FIG. 2 is a top plan view of a portion of a prior art leadframe strip, such as shown in FIG. 1, after die mounting, wire bonding, and encapsulation (molding).

FIG. 2 is a top plan view of a portion of a prior art leadframe sheet 10. It includes three interconnected leadframes 40A, 40B, 40C that are held in fixed relationship with one another by leadframe connecting strips 36, 38. Each of the leadframes has a die pad 42, which is sometimes referred to in the art as a "die attachment pad" or "die paddle." The die pad 42 is initially connected to other portions of the leadframe, e.g. 40A as by thin metal bars (not shown in FIG. 2), which are removed during IC package formation. A plurality of longitudinally extending leads 44, 46, 48, etc., extend outwardly relative to a first lateral side of the die pad 42. A second plurality of longitudinally extending leads 43, 45, 47 extend outwardly relative to a second lateral side of the die pad 42. A first (inner) damn bar 52 is integrally formed with and intersects portions of each of the leads 44, 46, 48, etc., near the proximal end of those leads, i.e., at a location close to the die 42. A second (outer) dam bar 54 is integrally formed with and connects distal (outer) end portions of each of the leads 44, 46, 48. Similarly longitudinally leads 43, 45, 47, etc., extend outwardly relative to the other side of the die pad 42. A first (inner) damn bar 53 intersects portions of leads 43, 45, etc. near the proximal ends thereof. A second (outer) dam bar 55 connects the distal end portions of leads 43, 45, etc.

Figure 3:
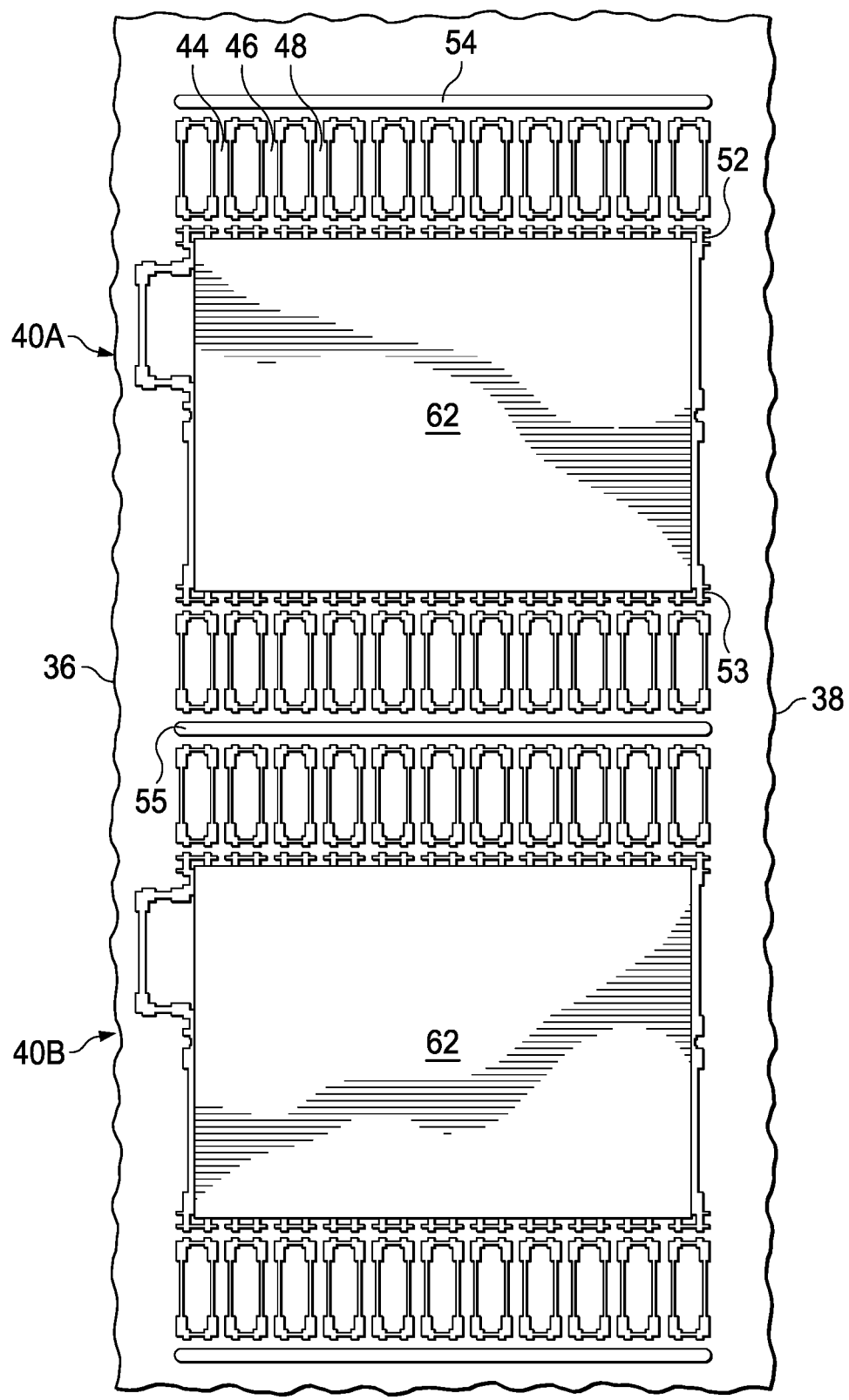
FIG. 3 is a top plan view of a portion of a prior art leadframe strip such as shown in FIG. 1, having dies mounted on leadframe portions thereof.

FIG. 3 is a top plan view of a portion of a leadframe strip of FIG. 2 after an integrated circuit chips (not visible) has been attached to each of the die pads 42, FIG. 2), inner portions of each of the leads e.g., 44, 46, 48, etc., have been conventionally wire bonded to a corresponding electrical contact surface on the die; and 3) the die (not shown and bond wires (not shown) and an inner portion of each of the leads, e.g., 44, 46, 48, etc. has been encapsulated in epoxy mold compound 62.

Figure 4:
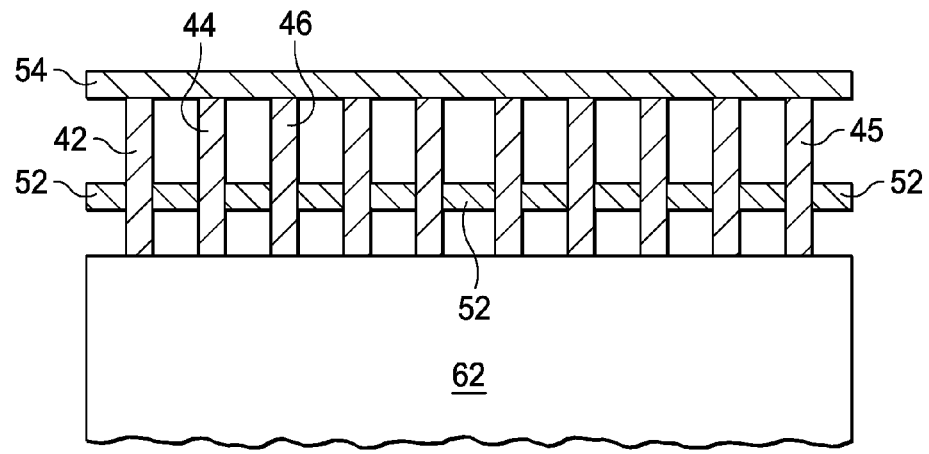
FIG. 4 is a schematic top plan view of portions of a prior art die mounted, wire bond connected and molded SOP leadframe assembly including a plurality of outwardly extending leads that are connected by first and second dam bars.

FIG. 4 is a schematic representation showing leads 42, 44, 46, etc. of a single prior art leadframe, such as 40A or 40B in FIG. 3, before singulation. It also shows the connections of the first dam bar 52 and second dam bar 54 to the associated leads 42, 44, 46, etc. This entire combination of leads 42, 44, etc., and first and second dam bars 52, 54 is sometimes referred to in the art as the "outer leads."

Figure 5:
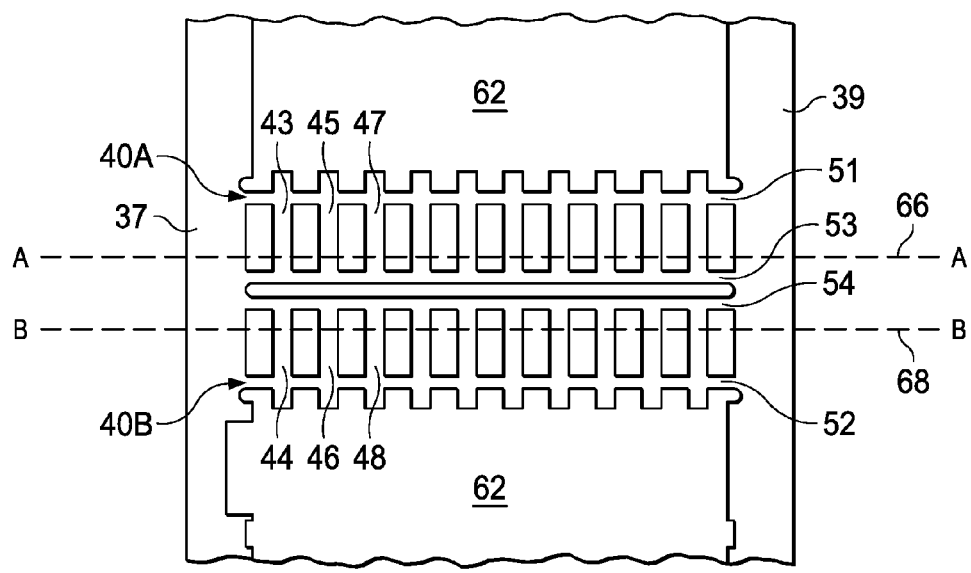
FIG. 5 is a top plan view of a prior art assembly with two adjacent leadframe assemblies such as shown in FIG. 4, wherein leads of each leadframe are connected by first and second dam bars.

FIG. 5 is a top plan view similar to that of FIG. 2. It shows the leads 43, 45, 47, etc., of leadframe 40A connected by a first damn bar 51 at the proximal ends thereof and second dam bar 53 at the distal ends thereof. It also shows that the leads 44, 46, 48, etc. of die 40B are aligned with corresponding leads 43, 45, 47, etc., of the leadframe 40A. Leads 44, 46, 48, etc., are connected by first 52 and second dam bars 52, 54 of leadframe 40B. FIG. 5 also illustrates the cut paths or saw streets AA and BB that are used to remove the second dam bars 53, 54 and end portions of each of the leads during singulation of the die mounted, wire bonded and molded leadframes 40A 40B. It will be appreciated from FIG. 5 that a substantial portion of the leadframe strip 10, FIG. 1, is taken up by the second dam bars 53, 54 and associated end portions of attached leads, i.e., the entire area between AA and BB, which are later removed. The portions of each inner dam bar 51, 52 that extend between adjacent leads, e.g., 44, 46, are removed during package formation.

The specific type of leadframe illustrated in the embodiments of FIGS. 1-5 is an SOP type leadframe in which the leads are designed to project outwardly from two opposite sides of the SOP produced using this type leadframe. It will be appreciated that a QFP type leadframe has outwardly projecting leads on each of its four lateral sides that extend outwardly from the molded portion of the package. Each lateral side of a QFP package has first and second dam bars connecting the leads, which are subsequently removed during package formation.

Figure 6:
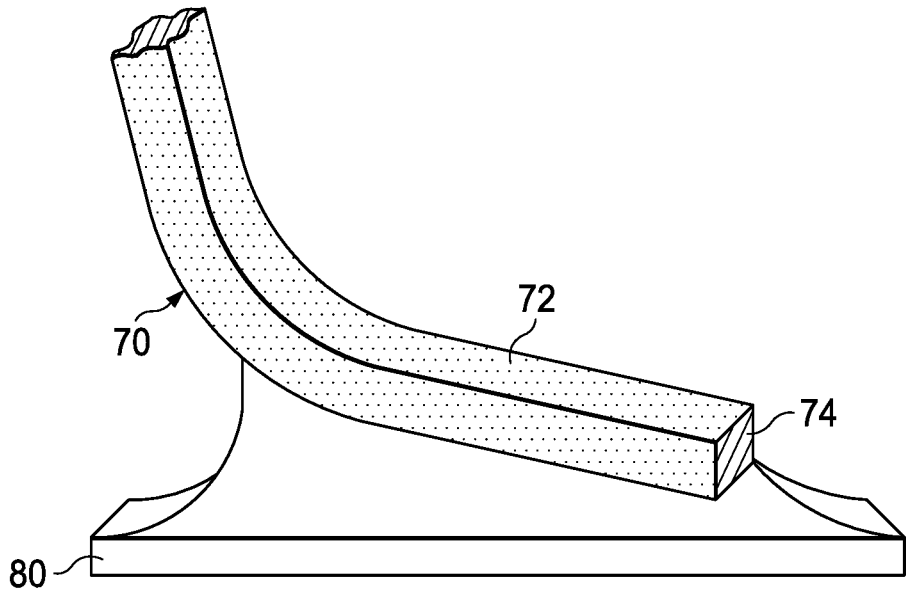
FIG. 6 is a schematic isometric view of a prior art assembly including a leadframe lead with an unplated terminal end engaging a contact portion of a printed circuit board.

FIG. 6 illustrates a prior art lead 70 extending from an associated integrated circuit package, which was formed from a leadframe, such as molded leadframe 40A in FIG. 5, and which has the dam bars trimmed form the lead 70. The lead 70 and associated leadframe is made from a first substance, such as copper, which is subject to oxidation/corrosion. The lead 70 is plated with a plating layer 72 made from a substance, such as for example nickel, palladium, gold or tin, that is less subject to corrosion than copper. This plating process takes place before the sawing/singulation step shown in dashed lines in FIG. 5. In one prior art embodiment the entire leadframe is plated before the molding process. In another prior art embodiment, just the exposed portions of the leads are plated, after molding but before singulation. With either plating method, singulation exposes copper at tip 74 of the lead 70. The lead 70 in this embodiment is a gull wing type lead that has been appropriately bent for attachment to a contact portion 80 of a printed circuit board. In other prior art IC packages the leads are not bent prior to attachment.

Figure 7:
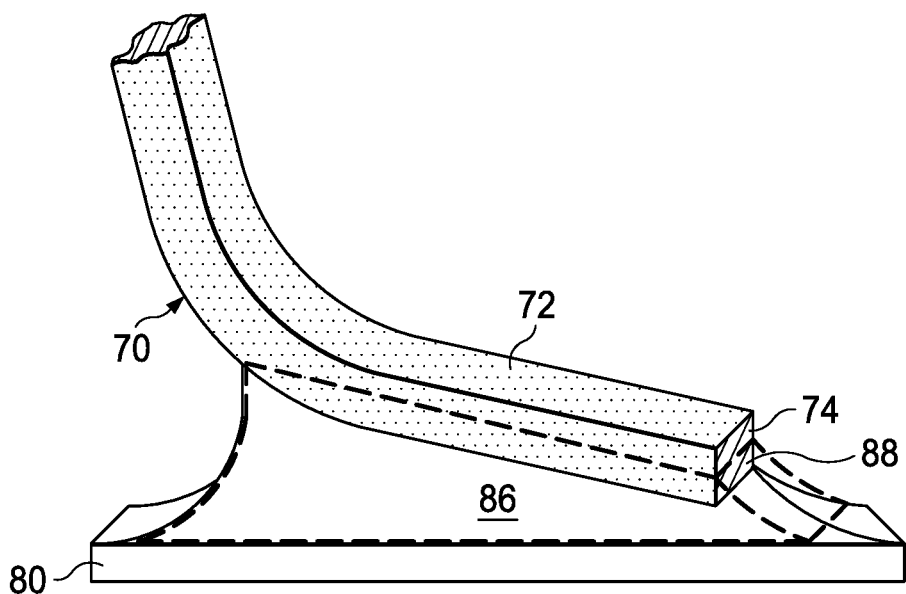
FIG. 7 is a schematic isometric view of the lead and printed circuit board contact portion of FIG. 6 after solder bonding.

As shown in FIG. 7, the lead 70 is attached to printed circuit board contact 80 with a layer of solder 86. In some cases the solder 86 is not placed around the area of the tip 74, in other cases (as shown) it is. However, because the copper at tip 74 is exposed, even when solder is placed in contact with the tip 74, the exposed tip 74 does not wet well and thus the solder bond between tip 74 and contact 80 is usually poor. Thus, the exposed copper tip 74 may render the lead 70 subject to disconnection from contact portion 80 of the printed circuit board 80.

Figure 11:
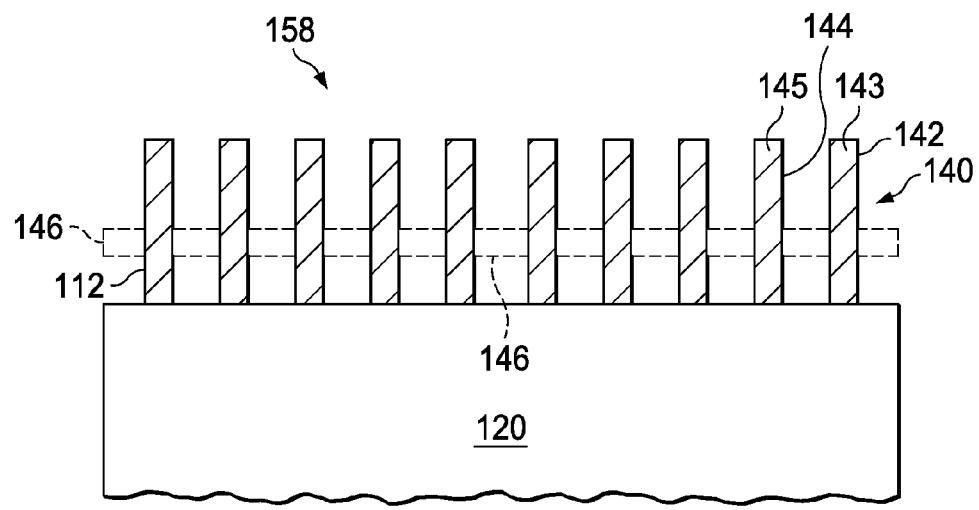
FIG. 11 is a schematic top plan view of a portion of an SOP type IC package that includes one of the encapsulated leadframes of FIGS. 9 and 10 after singulation.

FIG. 8 is a top plan view of a portion of a new type of leadframe strip 110. The full leadframe strip 110 is shown in FIG. 11. As shown by FIG. 8, included in the leadframe strip 110 is a first leadframe 112 and identical second and third leadframes 114, 116 that are connected by parallel connecting strips 178, 180, which may be the similar to the connecting strips 36, 38 described with reference to FIG. 1. The first leadframe 112 has a first die attach pad 122. The die attach pad 122 has a first laterally extending side 124 and an opposite second laterally extending side 125. The die attach pad is initially attached to the rest of the leadframe as by support strips (not shown), which are conventionally removed during package formation.

As shown by FIG. 8, leadframe 112 has a first plurality of leads 130, including leads 132, 134, 136, etc., extending longitudinally outwardly relative the first laterally extending side 124 of the die attach pad 122. Each of these leads 132, 134, 136, etc., has a proximal end, for example 139 of lead 136, positioned in close, spaced apart relationship with the lateral side, e.g., 124 of the die attach pad 122. These proximal ends are initially connected to one another by a first damn bar 137 when the leadframe is fabricated. This first dam bar 137 is subsequently removed from between adjacent leads in a conventional manner at the time of singulation, thereby separating the leads 130 such that they are not in electrical contact with one another. Each of the leads 132, 134, etc., has a corresponding distal end 133, 135, etc. The distal ends 133, 135, etc., are free ends, i.e., these distal ends 133, 135, etc., are not connected to one another by a damn bar. (All of the leadframes 112, 114 and 116 have leads formed without second (outer) dam bars so as to provide such free ends.) A second plurality of leads 140 extend longitudinally outwardly from positions near the second lateral side 125 of the die attach pad 122. The second plurality of leads 140 may be the mirror image of the first plurality of leads 130. The second plurality of leads 140 includes leads 142, 144, etc. having corresponding free ends 143, and 145, etc., and having corresponding proximal ends connected by a first damn bar 146.

As previously mentioned the leadframes 112, 114, 116 in the illustrated embodiment of FIG. 8 are identical. Corresponding portions of leadframes 114 and 116 are labeled identically to leadframe 112, except that reference numerals for leadframe 114 end with an "A" and for leadframe 116 end with a "B". The leadframes 112, 114, 116 are constructed and arranged such that the free ends of the first set of leads, e.g., 130 of one leadframe, e.g. 112 are positioned in nontouching, close, aligned relationship with those of the second set of leads, e.g. 140A of an adjacent leadframe, e.g., 114.

Figure 9:
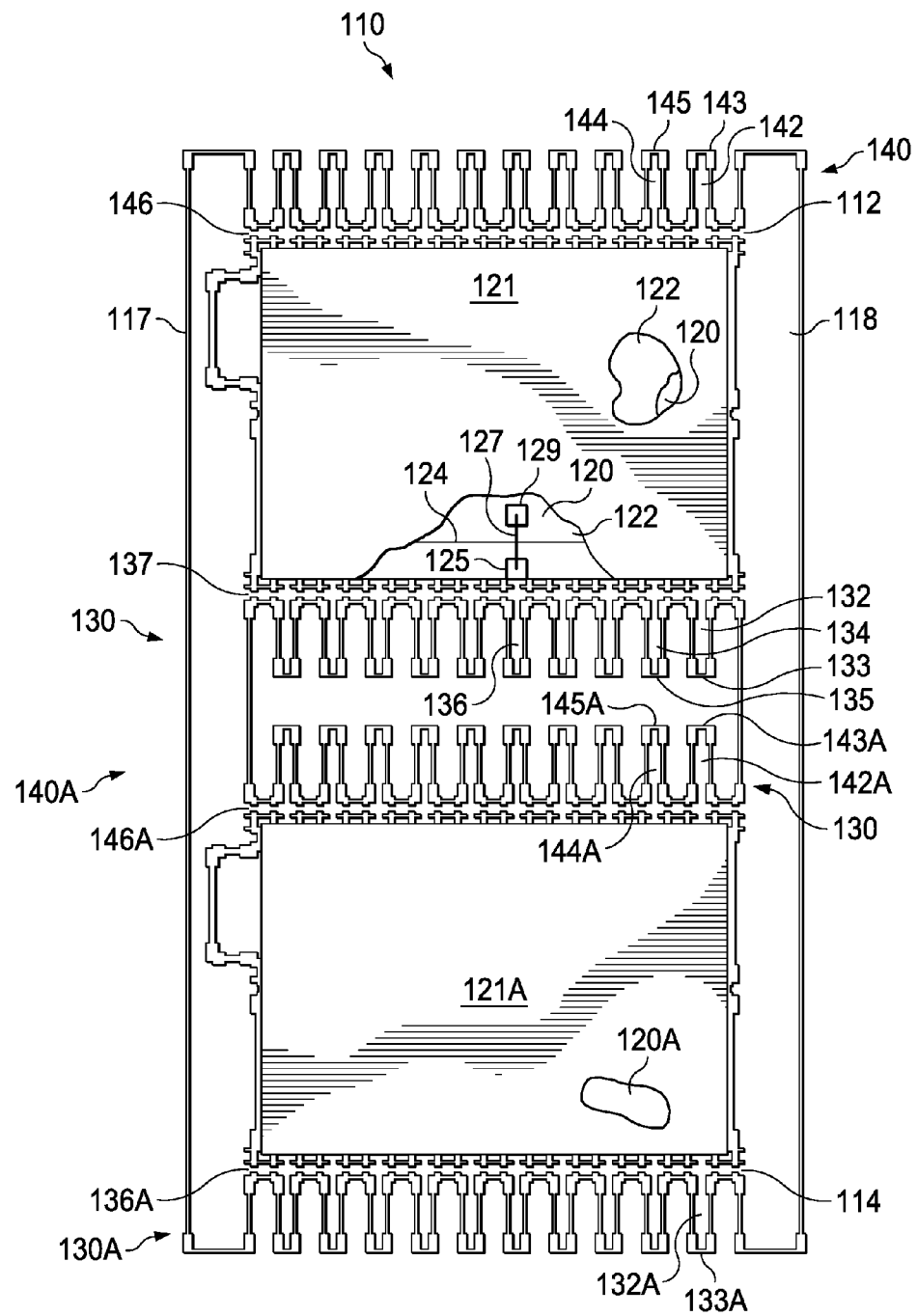
FIG. 9 is a top plan view of portions of a die mounted, wire bond connected and encapsulated SOP leadframe strip assembly including two leadframes of the type illustrated in FIG. 8.

FIG. 9 is a top plan view of two leadframe portions 112 and 114 of the new type leadframe strip 110 of FIG. 8, after completion of die mounting, wire bonding and molding. With respect to leadframe portion 112, a layer of encapsulating epoxy 121 covers a first die 120, a first die attach pad 122 positioned below the die 120, inner portions of leads 130 and 140 and bond wires 127 that connect the inner portions of the leads to contact pads on the die 120, as described in further detail below.

A first die 120 (shown only partially in FIG. 9) is mounted on the die attach pad 122 of the leadframe 112. The die attach pad 122 has a first laterally extending side 124 and an opposite second laterally extending side 125 (not visible in FIG. 9). A plurality of leads 130, including leads 132, 134, etc., extend longitudinally outwardly from a position proximate the first laterally extending side 124 of the die attach pad 122. Bond wires, e.g. 127 connect contact surfaces, e.g., 129 on the die 120 to an inner portion, e.g. 125, of a corresponding lead, e.g., 136. As previously mentioned, the proximal ends of the leads are initially connected to one another by a first damn bar 137 when the leadframe is fabricated. this first dam bar 137 is subsequently removed in a conventional manner after a molding step, thereby separating the leads such that they are not in electrical contact with one another. Each of the leads 132, 134, etc., has a corresponding distal end 133, 135, etc. The distal ends 133, 135, etc., are free ends, i.e., these ends 133, 135, etc., are not connected to one another by a damn bar. A second plurality of leads 140 from the first leadframe 112 also extend longitudinally from near the second lateral side of the die attach pad 122. The second plurality of leads 140 may be the mirror image of the first plurality of leads 130. As previously mention with reference to FIG. 9, the first set of leads 130 of the leadframe 112 are positioned in close aligned relationship with the second set of leads 140A of leadframe 114.

Figure 10:
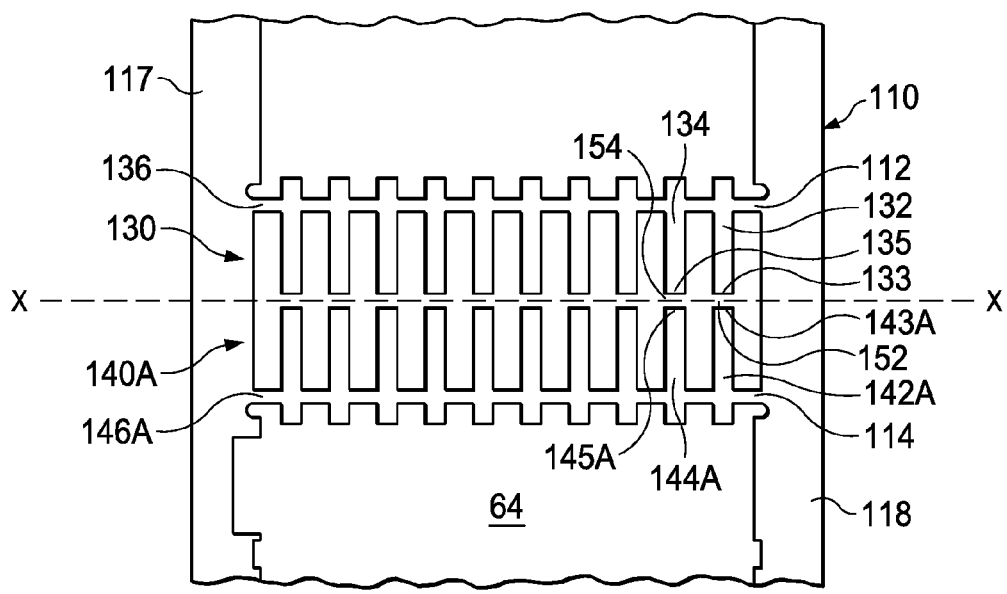
FIG. 10 is a schematic top plan view of a portion of an assembly such as shown in FIG. 9 and showing a singulation saw path.

FIG. 10 is a schematic top view of adjacent portions of the encapsulated leadframes 112 and 114 shown in FIG. 9. As shown by FIG. 10, the tip portions 133, 135, etc. of the first leadframe 112 are positioned directly opposite to the tip portions 143A, 145A of the second leadframe 114. Each corresponding set of aligned lead tips, e.g., 133, 143A; 135, 145A, are separated by a small gap, e.g. 152, 154. A singulation cutter makes a single cut XX that extends through these gaps 152, 154, etc. to separate the leadframes 112, 114.

FIG. 11 is a schematic top plan view of an integrated circuit package 158, which includes leadframe 112. It is shown after it has been singulated from the rest of the die mounted, wire bonded and molded leadframe strip shown in FIGS. 9 and 10. At this point the first dam bar 146 has been conventionally removed from between adjacent leads, as indicated by dashed lines in FIG. 11.

FIG. 12 illustrates a leadframe strip 110 in which the individual leadframes have the structure shown in FIGS. 8 and 9. Like the prior art leadframe strip 10 of FIG. 1, the new leadframe strip 110 has a leadframe grid portion 162 bordered on each side by a rail 117, 118. The leadframes that are singulated from the new leadframe strip 110 are the same size as those in the prior art strip 10. The number of leadframes in the new leadframe strip 110 is the same as the number of leadframes in the prior art strip 10. However, by eliminating the second damn bars from the structure of each leadframe, the leadframe grid portion 162 of the new strip 110 may have a reduced dimension between side rails 164, 166. This dimension may be on the order of 10% to 15% smaller than that of the corresponding dimension of the leadframe strip 10. The length of each leadframe strip 10 and 110 is the same, thus the total area between side rails of the new strip 110 is about 10% to 15% smaller that of the corresponding area of the old strip. Since the cost of a leadframe strip is roughly proportional to the size of the area between rails, the new strip 110 may achieve a savings in material cost on the order of 10% to 15% over the prior art strip 10.

Figure 13:
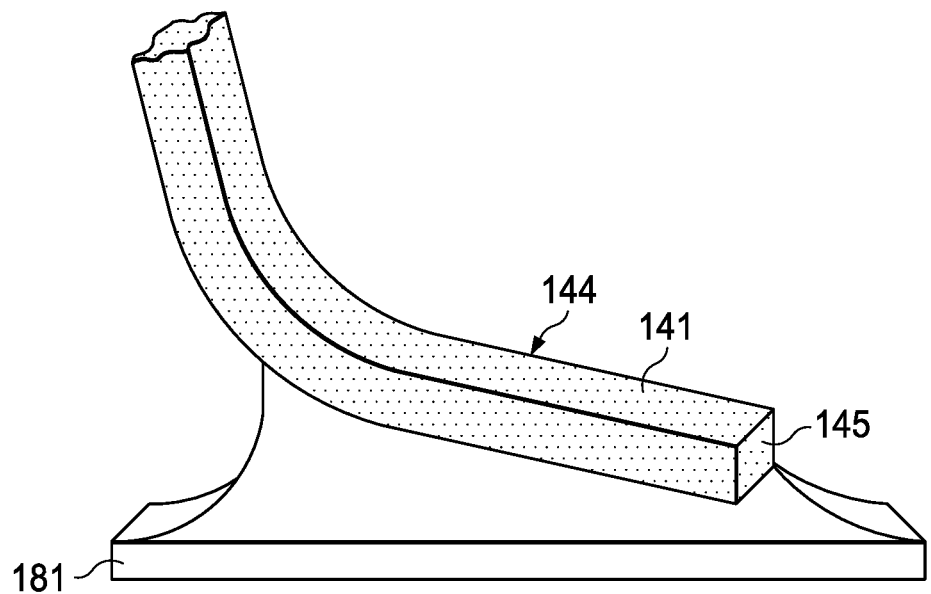
FIG. 13 is an isometric view of part of a leadframe lead having a plated tip portion, with the lead engaged with a contact of a printed circuit board.
Figure 14:
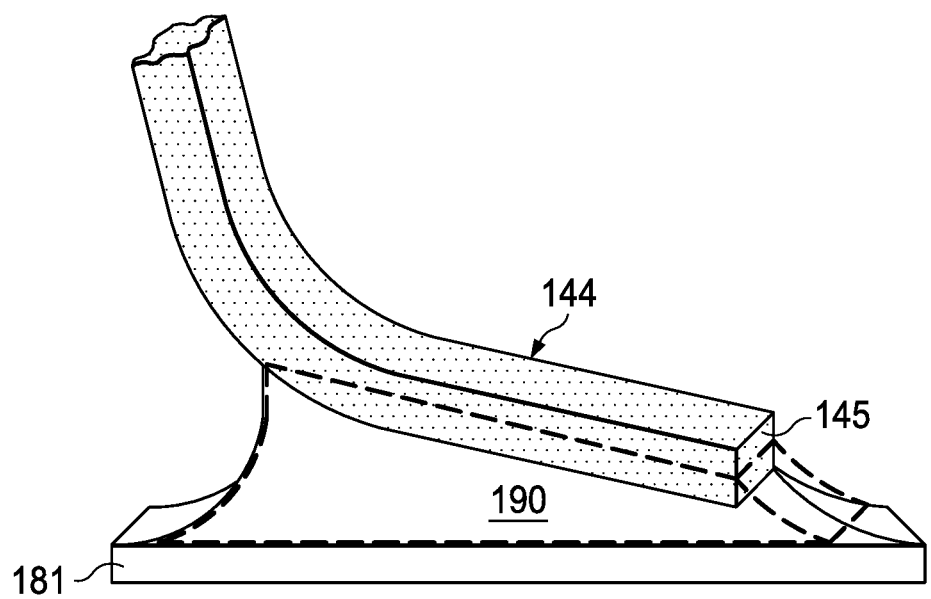
FIG. 14 is a top plan view of the assembly of FIG. 13 with a layer of solder bonding the lead to the printed circuit board contact.

FIGS. 13 and 14 illustrate another advantage of the new leadframe strip 110 over the prior art. FIG. 13 illustrates a lead 144 of an integrated circuit die package, such as integrated circuit package 158, illustrated in FIG. 11. The lead 144 has been bent into an appropriate shape for attachment to a contact surface 181 of a printed circuit board. The outer surface of the lead 144 in the portion of the lead that is to be attached to the contact surface 181 has a metal plating layer 141 that completely covers the lead 144, including the tip portion 145. The tip portion 145 in FIG. 14 is plated because the lead 144 was not severed after it was plated. Whether the plating process takes place before or after the leadframe strip 110 is molded, there is no reason to sever the lead 144 after plating because it is not connected to adjacent leads by a dam bar. Also, at the time the leadframe strip 162 is made, all of the leads are made the correct length for their intended purpose so that no subsequent severing of the leads is needed.

As shown by FIG. 14, since the tip 145 of lead 144 is plated, the solder 190 bonds to the plated tip 145 as well as to the other plated portions of the lead 144. For that reason the lead 144 with the plated tip 145 will generally provide an improved connection of the lead 144 to the printed circuit board, as compared to that of the prior art shown in FIG. 7.

Figure 15:
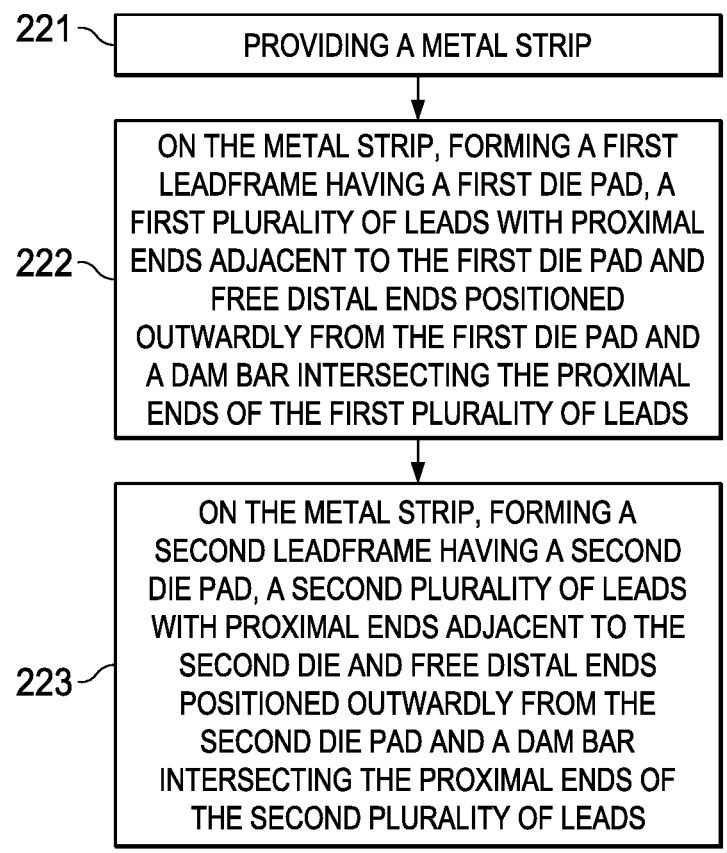
FIG. 15 is a flow chart of a method of making a plurality of integrated circuit packages.

FIG. 15 discloses a method of making a plurality of integrated circuit packages. The method includes, as shown at 221, providing a metal strip and, as shown at 222, on the metal strip, forming a first leadframe having a first die pad, a first plurality of leads with proximal ends near to the first die pad and free distal ends positioned outwardly from the first die pad and a dam bar intersecting the proximal ends of the first plurality of leads. The method further includes, as shown at 223, on the metal strip, forming a second leadframe having a second die pad, a second plurality of leads with proximal ends connected to the second die pad and free distal ends positioned outwardly from the second die pad and a dam bar intersecting the proximal ends of the second plurality of leads.

Although a detailed description of certain embodiments of a leadframe strip and leadframes provided thereby and methods of making integrated circuit packages are described in detail herein, alternative embodiments of such leadframe strips, leadframes and methods will become obvious to those skilled in the art, after reading this disclosure. For example, while the illustrative embodiments of leadframe strips shown herein are all SOP type leadframes, a similar improvement in leadframe strip cost and lead bonding to PC boards, etc., may be achieved for QFP type leadframes by making QFP type leadframe strips with outwardly extending leads that terminate in free distal ends on all four sides of the die pad. It is intended that the appended claims be broadly construed so as to cover such alternative embodiments, except as limited by the prior art.

What is claimed is:

1. A method of making a plurality of integrated circuit packages comprising:
   providing a metal strip;

on the metal strip, forming a first leadframe having a first die pad having first and second lateral sides, a first plurality of leads with proximal ends adjacent to the first die pad and free distal ends positioned outwardly from the first die pad and a first laterally extending leadframe dam bar intersecting the proximal ends of the first plurality of leads; and on the metal strip, forming a second leadframe having a second die pad having first and second lateral sides, a second plurality of leads with proximal ends adjacent to the second die pad and free distal ends positioned outwardly from the second die pad and a second laterally extending leadframe dam bar intersecting the proximal ends of the second plurality of leads, said free distal ends of said second plurality of leads are positioned being aligned adjacent and non-touching relationship with corresponding said free distal ends of said first plurality of leads.

2. The method of claim 1 further comprising mounting a first die on the first die pad.

3. The method of claim 2 further comprising wire bond connecting contact portions of the first die to the proximal ends of the first plurality of leads respectively.

4. The method of claim 3 further comprising encapsulating the first die and the proximal ends of the first plurality of leads and the wire bonds with a mold compound.

5. The method of claim 4 further comprising plating at least the free distal ends including the tips of the first plurality of leads with a material different from a material from which the first leadframe is made.

6. The method of claim 5 wherein said plating comprises plating prior to said mounting the first die on the first die pad.

7. The method of claim 5 wherein said plating comprises plating after said encapsulating.

8. The method of claim 5 further comprising soldering at least one of the first plurality of leads on the first leadframe to a circuit board including soldering the plated tips of the at least one of the first plurality of leads to the circuit board.

9. The method of claim 4 comprising removing portions of the first dam bar between adjacent ones of the first plurality of leads after said encapsulating.

10. The method of claim 1 further comprising separating the first leadframe from the second leadframe with a cut extending between the free distal ends of the first plurality of leads and the free distal ends of the second plurality of leads.

11. The method of claim 1 further comprising removing portions of the first dam bar between adjacent ones of the first plurality of leads.

* * * * *